US012761805B2

(12) United States Patent
Ko et al.

(10) Patent No.: US 12,761,805 B2
(45) Date of Patent: Oct. 13, 2026

(54) VOLATILE MEMORY DEVICE INCLUDED IN MEMORY SYSTEM AND METHOD FOR EXTENDING LIFE EXPECTANCY THEREOF

(71) Applicant: Samsung Electronics Co., Ltd., Suwon-si (KR)

(72) Inventors: Junyoung Ko, Suwon-si (KR); Jungmin Bak, Suwon-si (KR); Changhwi Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 442 days.

(21) Appl. No.: 18/354,919

(22) Filed: Jul. 19, 2023

(65) Prior Publication Data

US 2024/0248610 A1 Jul. 25, 2024

(30) Foreign Application Priority Data

Jan. 25, 2023 (KR) ........................ 10-2023-0009595

(51) Int. Cl.

*G06F 3/06* (2006.01)
*G11C 11/4074* (2006.01)
*G11C 11/4096* (2006.01)

(52) U.S. Cl.

CPC .......... *G06F 3/0616* (2013.01); *G06F 3/0653* (2013.01); *G06F 3/0673* (2013.01); *G11C 11/4074* (2013.01); *G11C 11/4096* (2013.01)

(58) Field of Classification Search

CPC .... G06F 3/0616; G06F 3/0653; G06F 3/0673; G11C 11/4074; G11C 11/4096; G11C 11/4085; G11C 29/08; G11C 29/50

See application file for complete search history.

(56) References Cited

U.S. PATENT DOCUMENTS

| | | | |
|---|---|---|---|
| 6,522,567 B2 | 2/2003 | Iwanari | |
| 7,642,105 B2 | 1/2010 | Co et al. | |
| 9,013,920 B2 | 4/2015 | Stoev et al. | |
| 10,832,754 B1 | 11/2020 | Hopper et al. | |
| 11,081,205 B2 | 8/2021 | Kim et al. | |
| 11,127,472 B2 | 9/2021 | Lee et al. | |
| 2010/0188886 A1* | 7/2010 | Behrends ......... | G11C 29/12005 365/201 |

FOREIGN PATENT DOCUMENTS

JP 5733033 B2 4/2015

OTHER PUBLICATIONS

Ma et al., RBER-Aware Lifetime Prediction Scheme for 3D-TLC NAND Flash Memory, IEEE, Apr. 2019, 13 pages (Year: 2019).*

* cited by examiner

*Primary Examiner* — Gary W. Cygiel

(74) *Attorney, Agent, or Firm* — Wolf, Greenfield & Sacks, P.C.

(57) ABSTRACT

A method for extending life expectancy of a volatile memory device includes performing a life test corresponding to memory cells included in the volatile memory device, determining whether the memory cells have a normal life state or a shrink-life state indicating a life expectancy that is reduced relative to the normal life state based on a result of the life test, and decreasing a wordline voltage, which is applied to a wordline connected to the memory cells, to a first voltage that is less than a second voltage that is applied to the wordline in the normal life state during a read operation or a write operation responsive to determining that the memory cells have the shrink-life state.

20 Claims, 14 Drawing Sheets

FIG.9

| Condition | Output | Fail Bit |
|---|---|---|
| iMBC < iR1 | ALL=0 | 0 |
| iR1 ≤ iMBC < iR2 | OUT1=1 | 1 |
| iR2 ≤ iMBC < iR3 | OUT2=1 | 2 |
| • • • | | |
| iR(n-2) ≤ iMBC < iR(n-1) | OUT(n-2)=1 | n-2 |
| iR(n-1) ≤ iMBC < iRn | OUT(n-1)=1 | n-1 |
| iRn ≤ iMBC | ALL=1 | n |

FIG.10

| Fail Bit | Life case 1 | Life case 2 | Life case 3 | Life case 4 |
| --- | --- | --- | --- | --- |
| FB < N/4 | Normal (LEC1) | Normal (LEC1) | Normal (LEC1) | Normal (LEC1) |
| N/4 ≤ FB < N/2 | Life shrink (LEC2) | | | Life shrink 1 (LEC21) |
| N/2 ≤ FB < 3N/4 | | Life shrink (LEC2) | | Life shrink 2 (LEC22) |
| 3N/4 ≤ FB | | | Life shrink (LEC2) | Life shrink (LEC23) |

VOLATILE MEMORY DEVICE INCLUDED IN MEMORY SYSTEM AND METHOD FOR EXTENDING LIFE EXPECTANCY THEREOF

CROSS-REFERENCE TO RELATED APPLICATIONS

This application claims priority under 35 U.S.C. § 119 to Korean Patent Application No. 10-2023-0009595 filed on Jan. 25, 2023, in the Korean Intellectual Property Office, the disclosures of which are incorporated by reference herein in their entireties.

FIELD

Embodiments of the present disclosure described herein relate to a volatile memory device, and more particularly, relate to a volatile memory device included in a memory system and a method for extending life expectancy thereof.

BACKGROUND

Semiconductor memory devices may be classified into volatile memory devices and nonvolatile memory devices. Volatile memory devices, for example, a dynamic random access memory (DRAM) device and a static random access memory (SRAM) device, have high reading and writing speeds, but lose their stored data when their power supplies are interrupted. Meanwhile, nonvolatile memory devices can retain their stored data even when their power supplies are interrupted.

A representative example of volatile memory is a DRAM. A memory cell of a volatile memory may include a single N-type transistor, serving as a switch, and a single capacitor storing electric charges (data). Binary information "1" or "0" may correspond to the presence or absence of the electric charges stored in the capacitor in the memory cell, for example, whether a terminal voltage of a cell capacitor is high or low. A memory cell may be connected to a wordline and a bitline. The bitline may be connected to a sense amplifier. The sense amplifier may sense data, stored in the memory cell, through a bitline based on a voltage applied to the wordline.

Memory cells of a volatile memory may be deteriorated as a result of various factors. When the memory cells are deteriorated, performance of the volatile memory may be degraded. Furthermore, when the memory cells are deteriorated, life expectancy of the volatile memory may be reduced.

SUMMARY

Embodiments of the present disclosure provide a volatile memory device that is configured to predict life expectancy of a memory cell and then reduce or decrease or drop a voltage applied in wordline to extend the life expectancy of the memory cell when it is determined that the life expectancy of the memory cell is reduced.

Embodiments of the present disclosure provide a volatile memory device that is configured to predict life expectancy of a memory cell, and receive a lower or reduced supply voltage from a memory controller to extend the life expectancy of the memory cell when it is determined that the life expectancy of the memory cell is reduced.

According to an embodiment, a method for extending life expectancy of a volatile memory device, includes executing, by a control logic that is coupled to memory cells of the volatile memory device, operations comprising: performing a life test for the memory cells included in the volatile memory device; determining whether the memory cells have a normal life state or a shrink-life state indicating a life expectancy that is reduced (relative to the normal life state) based on a result of the life test; and decreasing a wordline voltage, which is applied to a wordline connected to the memory cells, to a first voltage that is less than a second voltage that is applied to the wordline in the normal life state during a read operation or a write operation responsive to determining that the memory cells have the shrink-life state.

According to an embodiment, a method for extending life expectancy of a volatile memory device, includes executing, by a control logic that is coupled to memory cells of the volatile memory device, operations comprising: performing a life test for the memory cells included in the volatile memory device; determining whether the memory cells have a normal life state or a shrink-life state indicating a life expectancy that is reduced (relative to the normal life state) based on a result of the life test; and receiving a second supply voltage that is less than a first voltage supplied in the normal life state from a memory controller responsive to determining that the memory cells have the shrink-life state.

According to an embodiment, a method for extending life expectancy of a volatile memory device includes executing, by a control logic that is coupled to memory cells of the volatile memory device, operations comprising: verifying whether a state of the volatile memory device satisfies a first condition; performing a life test for the memory cells included in the volatile memory device when the state of the volatile memory device satisfies the first condition; verifying whether the state of the volatile memory device satisfies a second condition; decreasing a wordline voltage, which is applied to a wordline connected to the memory cells, to a first voltage that is less than a second voltage that is applied to the wordline in a normal life state during a read operation or a write operation when the state of the volatile memory device satisfies the second condition.

BRIEF DESCRIPTION OF THE FIGURES

The above and other objects and features of the present disclosure will become apparent by describing in detail embodiments thereof with reference to the accompanying drawings.

FIG. 9 is a table for predicting life expectancy of a memory device of FIG. 2 based on the result of the multi-bit counter of FIG. 8.

FIG. 10 is a life-evaluation-table for determining whether the life expectancy of the memory device of FIG. 2 is reduced based on a result of the life test of FIG. 5.

DETAILED DESCRIPTION OF EMBODIMENTS

Below, example embodiments of the present disclosure will be described in detail and clearly to such an extent that one of ordinary skill in the art can implement the inventive concepts. The terms "comprises," "comprising," "includes" and/or "including," when used herein, specify the presence of stated elements, but do not preclude the presence of additional elements. The term "and/or" includes any and all combinations of one or more of the associated listed items.

Below, a DRAM will be used as an example for illustrating features and functions of the present disclosure. However, other features and operations may be understood from information disclosed herein by a person of ordinary skill in the art. The present disclosure may be implemented by other embodiments or applied thereto. Further, the detailed description may be modified or changed according to viewpoints and applications without escaping from the scope, spirit, and other objects of the present disclosure.

Figure 1:
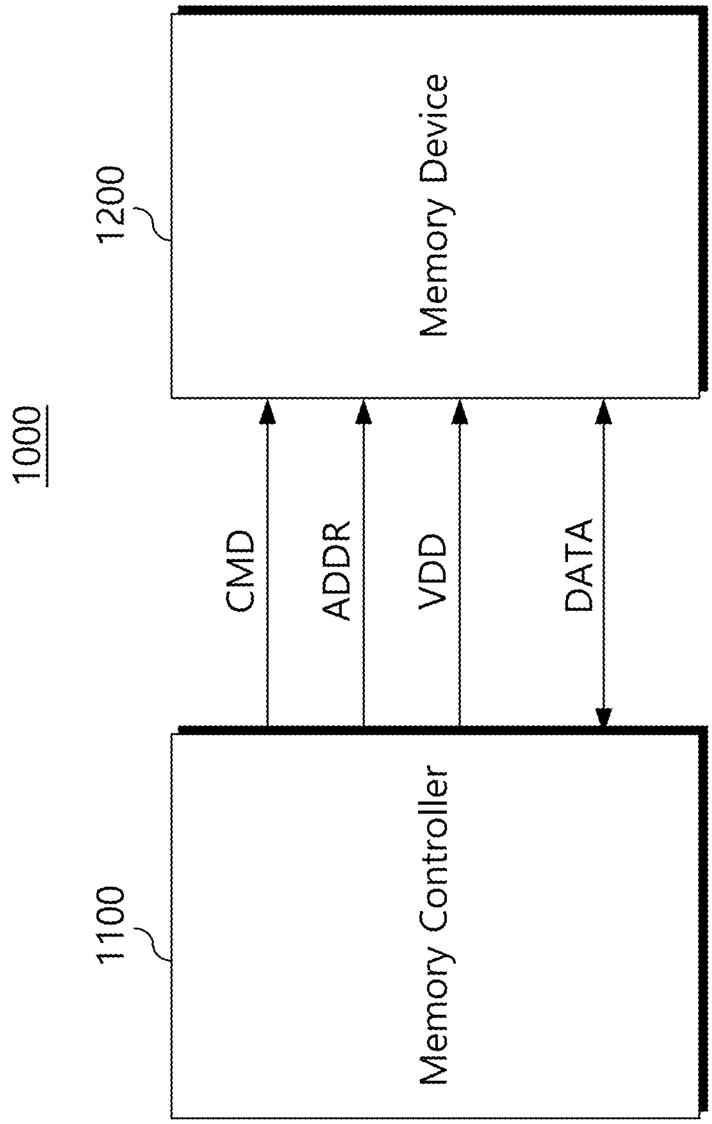
FIG. 1 is a block diagram illustrating a memory system according to an example embodiment.

FIG. 1 is a block diagram illustrating a memory system according to an example embodiment. Referring to FIG. 1, a memory system 1000 according to the present embodiment may include a memory controller 1100 and a memory device 1200.

According to an example embodiment, the memory controller 1100 may perform an access operation to write data in the memory device 1200 or to read data stored in the memory device 1200. For example, the memory controller 1100 may generate a command CMD and an address ADDR for writing data in the memory device 1200 or reading data stored in the memory device 1200. The memory controller 1100 may include at least one of a memory controller controlling the memory device 1200, a system-on-chip (SoC) such as an application processor (AP), a central processing unit (CPU), a digital signal processor (DSP), and a graphics processing unit (GPU).

According to an example embodiment, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA in the memory device 1200 or to read data DATA from the memory device 1200.

According to an example embodiment, the memory controller 1100 may generate various types of commands CMD to control the memory device 1200. For example, the memory controller 1100 may generate a bank request corresponding to a bank operation of changing a state of a memory bank, among memory banks, to read or write data DATA. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA is completed. In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to control a refresh operation on the memory banks. However, the types of commands CMD described herein are merely exemplary, and other types of commands CMD may be present.

According to an example embodiment, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively, the memory device 1200 may include or be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but example embodiments are not limited thereto.

According to an example embodiment, the memory banks may include a memory cell array divided in units of banks, a row decoder, a column decoder, a sense amplifier, a write driver, or the like. The memory banks may store data DATA, requested to be written in the memory device 1200, through the write driver and may read data DATA, requested to be read, using the sense amplifier. The memory banks may further include a component for a refresh operation of storing and maintaining data in the cell array, or select circuits based on an address.

According to an example embodiment, the memory device 1200 may receive a supply voltage VDD from the memory controller 1100. For example, the memory device 1200 may receive the supply voltage VDD to use the supply voltage VDD in an overall operation of the memory device 1200. The memory device 1200 may amplify the supply voltage VDD to generate an wordline voltage applied to an wordline during a read operation or a write operation. The memory device 1200 may perform a life test to predict life expectancy of memory cells included in the memory device 1200. When the life expectancy of the memory cells is reduced, the memory device 1200 may reduce or decrease (or "drop") the wordline voltage to extend the life expectancy of the memory cells. In addition, when the life expectancy of the memory cells is reduced, the memory controller 1100 may drop the supply voltage VDD to extend the life expectancy of the memory cells.

Figure 2:
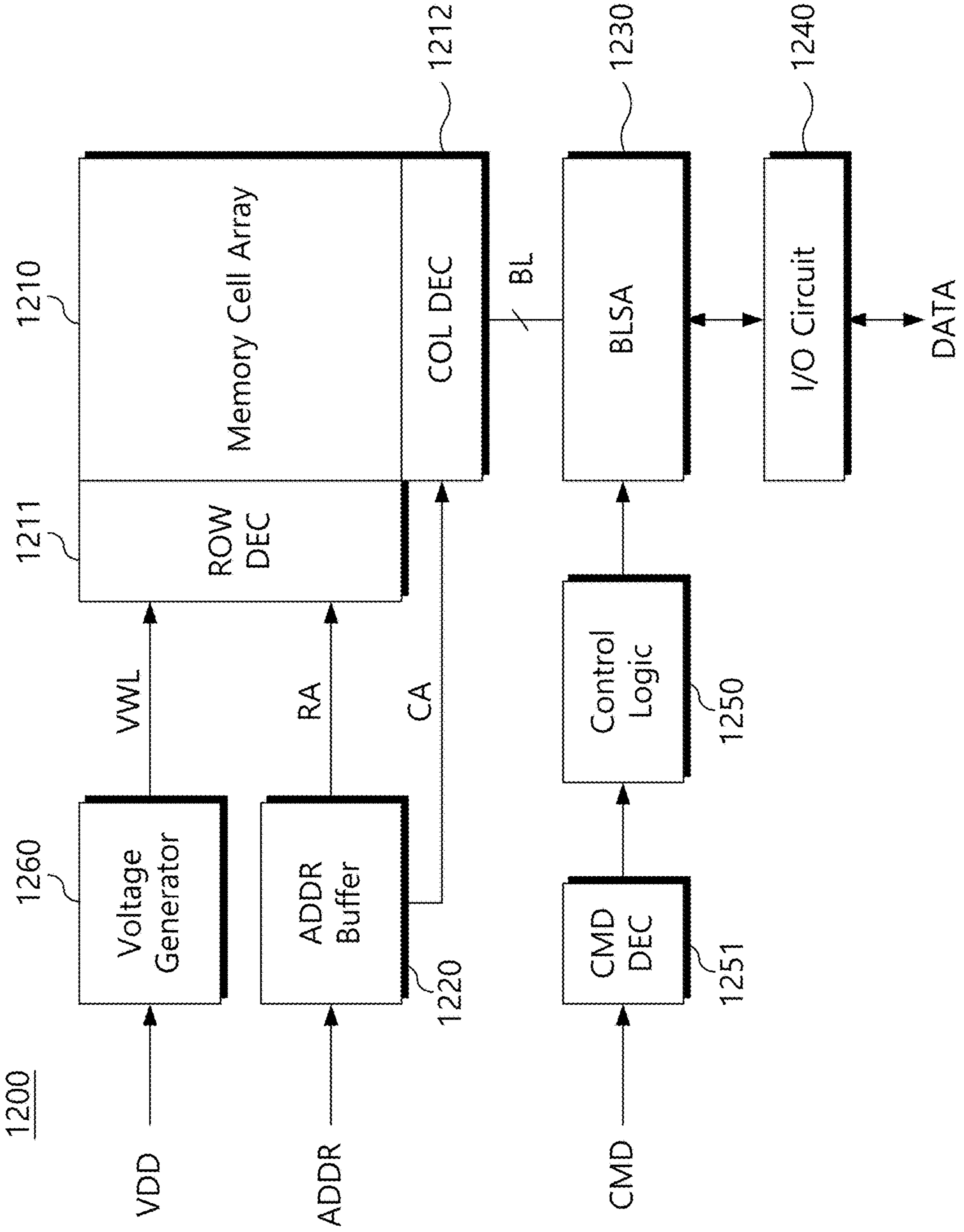
FIG. 2 is a block diagram illustrating a memory device of FIG. 1.

FIG. 2 is a block diagram illustrating a memory device of FIG. 1. Referring to FIG. 2, the memory device 1200 may include a memory cell array 1210, a row decoder 1211, a column decoder 1212, an address buffer 1220, a bitline sense amplifier 1230, an input/output circuit 1240, a command decoder 1251, control logic 1250, and a voltage generator 1260.

According to an example embodiment, the memory cell array 1210 may include a plurality of memory cells arranged in a matrix of rows and columns. For example, the memory cell array 1210 may include a plurality of wordlines and a plurality of bitlines BL connected to memory cells. The plurality of wordlines may be connected to rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA addressing a row of the memory cell array 1210 and a column address CA addressing a column of the memory cell array 1210. The address buffer 1220 may transmit the row address RA to the row decoder 1211 and may transmit the column address CA to the column decoder 1212.

According to an example embodiment, the row decoder 1211 may select one of the plurality of wordlines connected to the memory cell array 1210. The row decoder 1211 may decode the row address RA, received from the address buffer 1220, to select a single wordline corresponding to the row address RA and may activate the selected wordline.

According to an example embodiment, the column decoder 1212 may select a predetermined bitline from among the plurality of bitlines BL of the memory cell array 1210. The column decoder 1212 may decode the column address CA, received from the address buffer 1220, to select the predetermined bitline BL corresponding to the column address CA.

According to an example embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage. The input/output circuit 1240 may output data DATA to the memory controller 1100 through data lines based on a sensed and amplified voltage from the bitline sense amplifier 1230.

According to an example embodiment, the command decoder 1251 may decode a write enable signal /WE, a row address strobe signal /RAS, a column address strobe signal /CAS, and a chip select signal /CS received from the memory controller 1100 such that control signals corresponding to the command CMD are generated in the control logic 1250. The command CMD may include an active request, a read request, a write request, or a precharge request. The control logic 1250 may control an overall operation of the bitline sense amplifier 1230 through the control signals corresponding to the command CMD.

According to an example embodiment, the voltage generator 1260 may amplify the supply voltage VDD to output an wordline voltage VWL which is high voltage. For example, the memory device 1200 may receive the supply voltage VDD from the memory controller 1100. The voltage generator 1260 may include a voltage pump to amplify the supply voltage VDD. The memory device 1200 may perform the life test to predict the life expectancy of the memory cells included in the memory device 1200. When the life expectancy of the memory cells is reduced, the memory device 1200 may drop the wordline voltage VWL to extend the life expectancy of the memory cells. The voltage generator 1260 may generate wordline voltages VWLs which increase in a graded manner or fashion. When a normal life state (in which the life expectancy of the memory cells is maintained or otherwise not reduced) is predicted, the voltage generator 1260 may provide a wordline with a first wordline voltage, which is a greatest or comparatively higher voltage, during a read operation or a write operation. When a shrink-life state (in which the life expectancy of the memory cells is reduced or shortened relative to the normal life state) is predicted, the voltage generator 1260 may provide the wordline with a second wordline voltage, which is smaller than the first wordline voltage, during the read operation or the write operation. The terms "first," "second," etc., may be used herein merely to distinguish one element, function, etc. from another.

Figure 3:
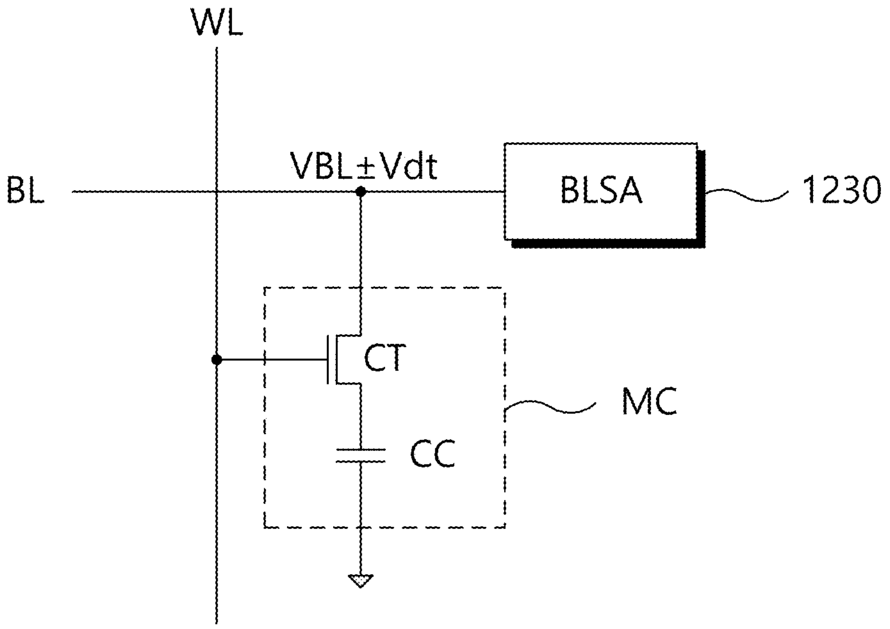
FIG. 3 is a diagram illustrating a bitline sense amplifier of FIG. 2 connected to a single memory cell.

FIG. 3 is a diagram illustrating a bitline sense amplifier of FIG. 2 connected to a single memory cell. Referring to FIGS. 2 and 3, a single memory cell MC included in the memory cell array 1210 may include a cell transistor CT and a cell capacitor CC. One end of the cell transistor CT may be connected to a bitline BL. The other end of the cell transistor CT may be connected to the cell capacitor CC. A gate of the cell transistor CT may be connected to a wordline WL.

According to an example embodiment, the memory device 1200 may perform a read operation or a refresh operation based on the amount of charges of the cell capacitor CC included in the memory cell MC. In this case, the bitline BL connected to the memory cell MC may be precharged to a precharge voltage VBL. Then, as the wordline WL is activated, a charge sharing operation may occur between the charges of the bitline BL charged to the precharge voltage VBL and the charges of the cell capacitor CC of the memory cell MC. The charge sharing operation may cause a voltage of a bitline BL to increase or decrease from the precharge voltage VBL by the voltage change amount Vdt. The bitline sense amplifier 1230 may sense the voltage change amount Vdt and may amplify the sensed voltage change amount Vdt. The bitline sense amplifier 1230 may measure the voltage of the bitline BL based on the voltage change amount Vdt, and may sense data stored in the memory cell MC based on the voltage of the bitline BL. As an example, when the voltage of the bitline BL increases from the precharge voltage VBL by the voltage change amount Vdt, the bitline sense amplifier 1230 may sense data of the memory cell MC as data at a high level (or logic "1"). When the voltage of the bitline BL decreases from the precharge voltage VBL by the voltage change amount Vdt, the bitline sense amplifier 1230 may sense the data of the memory cell MC as data at a low level (or logic "0").

Figure 4:
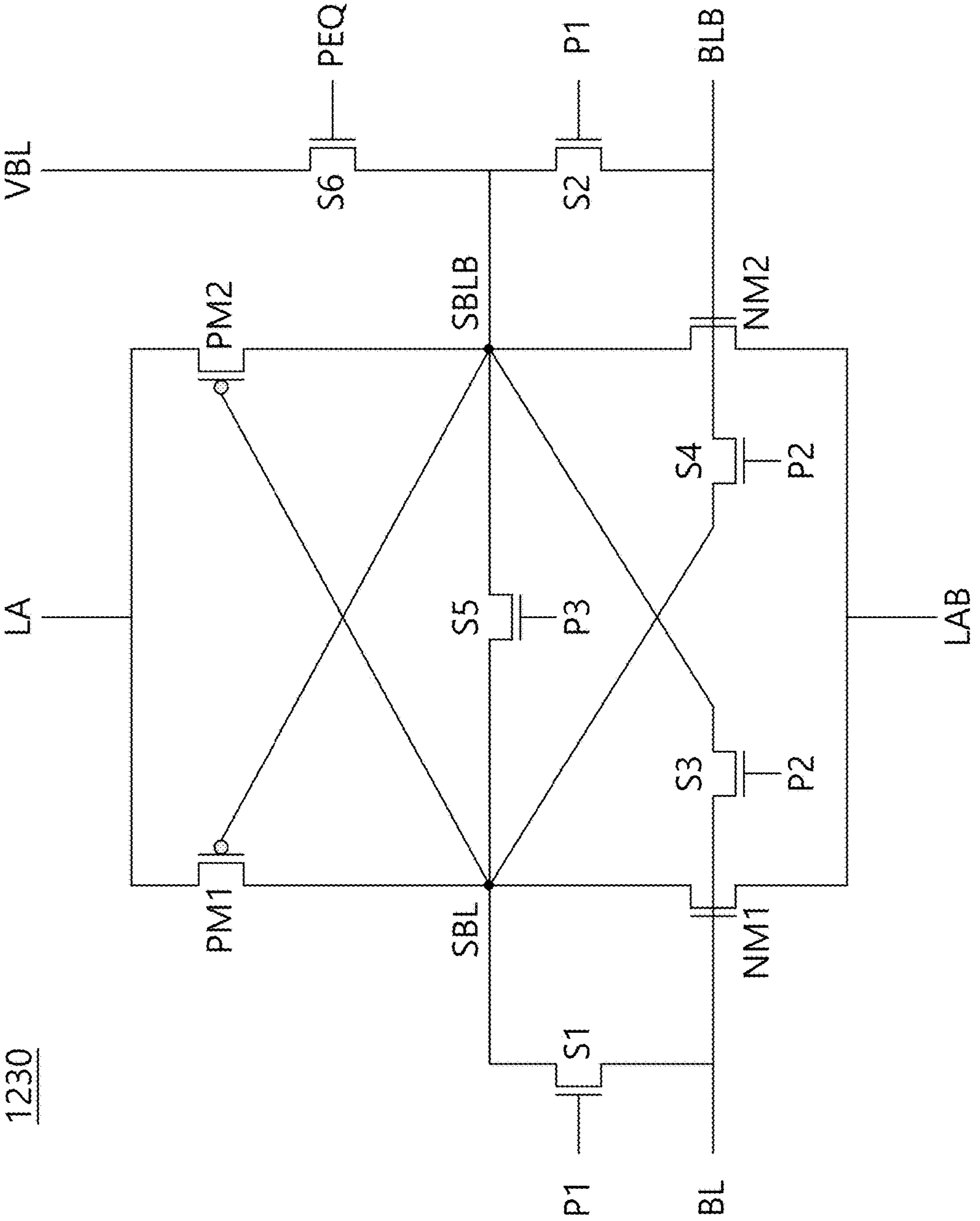
FIG. 4 is a diagram illustrating a bitline sense amplifier, connected to a single bitline, among bitline sense amplifiers of FIG. 2.

FIG. 4 is a diagram illustrating a bitline sense amplifier, connected to a single bitline, among bitline sense amplifiers of FIG. 2. Referring to FIGS. 2 to 4, the bitline sense amplifier 1230 may include an N-type sense amplifier and a P-type sense amplifier. For example, the N-type sense amplifier may include N-type transistors (for example, a first N-type transistor NM1 and a second N-type transistor NM2). The P-type sense amplifier may include P-type transistors (for example, a first P-type transistor PM1 and a second P-type transistor PM2). The N-type sense amplifier and the P-type sense amplifier may amplify the voltage change amount Vdt of the bitline BL depending on to a specified ratio during a bitline sensing operation.

According to an example embodiment, the bitline sense amplifier 1230 may include a plurality of switching transistors. For example, a first switching transistor S1 may be connected between the bitline BL and a sensing bitline SBL. The first switching transistor S1 may connect or disconnect between the bitline BL and the sensing bitline SBL based on a first switching signal P1. A second switching transistor S2 may be connected between a complementary bitline BLB and a complementary sensing bitline SBLB. The second switching transistor S2 may connect or disconnect between the complementary bitline BLB and the complementary sensing bitline SBLB based on the first switching signal P1. A third switching transistor S3 may be connected between the bitline BL and the complementary sensing bitline SBLB. The third switching transistor S3 may connect or disconnect between the bitline BL and the complementary sensing bitline SBLB based on a second switching signal P2. A fourth switching transistor S4 may be connected between the complementary bitline BLB and the sensing bitline SBL. The fourth switching transistor S4 may connect or disconnect between the complementary bitline BLB and the sensing bitline SBL based on the second switching signal P2. A fifth switching transistor S5 may be connected between the sensing bitline SBL and the complementary sensing bitline SBLB. The fifth switching transistor S5 may connect or disconnect between the sensing bitline SBL and the complementary sensing bitline SBLB based on a third switching signal P3. A sixth switching transistor S6 may be connected between a line of the precharge voltage VBL and the complementary sensing bitline SBLB. The sixth switching transistor S6 may connect or disconnect between the line of the precharge voltage VBL and the complementary sensing bitline SBLB based on an equalization signal PEQ.

According to an example embodiment, the N-type sense amplifier and the P-type sense amplifier are connected between the sensing bitline SBL and the complementary sensing bitline SBLB, and may sense and amplify a difference in voltage between the bitline BL and the complementary bitline BLB based on voltages of a control line LA and a complementary control line LAB. For example, one end of the first P-type transistor PM1 may be connected to the control line LA, the other end of the first P-type transistor PM1 may be connected to the sensing bitline SBL, and a gate of the first P-type transistor PM1 may be connected to the complementary sensing bitline SBLB. One end of the second P-type transistor PM2 may be connected to the control line LA, the other end of the second P-type transistor PM2 may be connected to the complementary sensing bitline SBLB, and a gate of the second P-type transistor PM2 may be connected to the sensing bitline SBL. One end of the first N-type transistor NM1 may be connected to the sensing bitline SBL, the other end of the first N-type transistor NM1 may be connected to the complementary control line LAB, and a gate of the first N-type transistor NM1 may be connected to the bitline BL. One end of the second N-type transistor NM2 may be connected to the complementary sensing bitline SBLB, the other end of the second N-type transistor NM2 may be connected to the complementary control line LAB, and a gate of the second N-type transistor NM2 may be connected to the complementary bitline BLB.

According to an example embodiment, the bitline sense amplifier 1230 may sense data of the memory cell MC connected to the bitline BL. For example, the bitline sense amplifier 1230 may control switching transistors (for example, the first to sixth switching transistors S1, S2, S3, S4, S5, and S6) during a precharge operation, a charge sharing operation, and a sensing operation. The bitline sense amplifier 1230 may sense data of the memory cell MC connected to the bitline BL through the precharge operation, the charge sharing operation, and the sensing operation.

Figure 5:
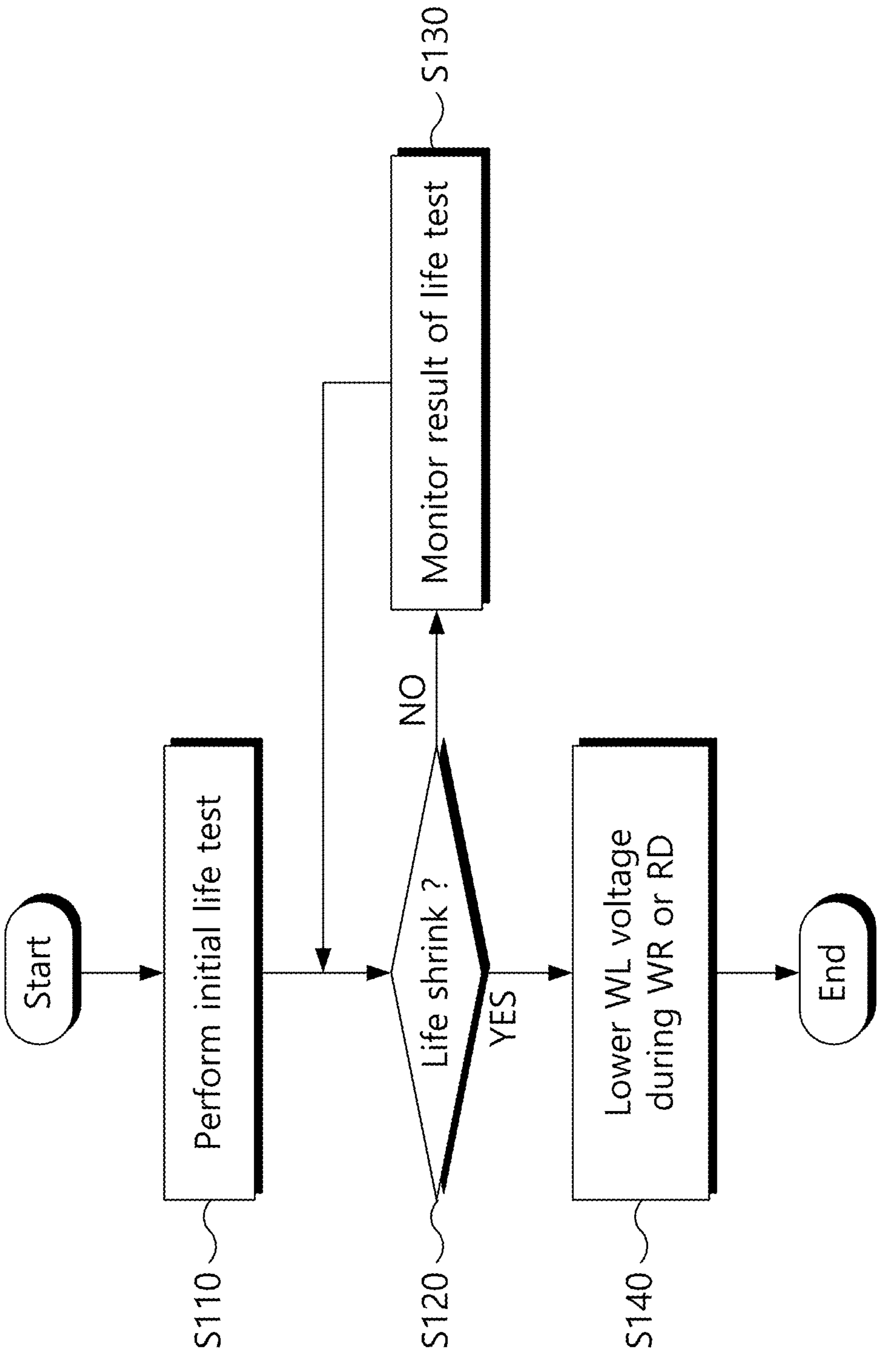
FIG. 5 is a flowchart illustrating an example embodiment of a method for extending life expectancy of a memory device of FIG. 2.

FIG. 5 is a flowchart illustrating an example embodiment of a method for extending life expectancy of a memory device of FIG. 2. Referring to FIGS. 2 and 5, when the life expectancy of the memory cells is reduced, the memory device 1200 may apply a specified voltage which is smaller than a wordline voltage set to default in a wordline WL to extend the life expectancy of the memory cells.

According to an example embodiment, in operation S110, the memory device 1200 may perform an initial life test. For example, the control logic 1250 may perform the initial life test for detecting a deterioration state of memory cells included in the memory cell array 1210. As an example, the control logic 1250 may perform a read operation after increasing a refresh period to determine a retention character of the memory cells, and then the control logic 1250 may count the number of memory cells representing read-failure. As another example, the control logic 1250 may detect life expectancy of memory cells based on a marking (for example, a using time, access frequency) specified by a memory chip included in the memory cell array 1210. However, this is merely exemplary and the control logic 1250 may detect the deterioration state of memory cells included in the memory cell array 1210 in various ways.

According to an example embodiment, in operation S120, the memory device 1200 may determine whether the memory cells included in the memory cell array 1210 are in a shrink-life state which means that the life expectancy of the memory cells is reduced. For example, the control logic 1250 may designate a life state of the memory cells based on the number of deteriorating memory cells confirmed by the life test. As an example, the control logic 1250 may distinguish the normal life state and the shrink-life state according to the number of the deteriorating memory cells. When the number of the deteriorating memory cells is smaller than a threshold or reference value, the control logic 1250 may determine the normal life state. When the number of the deteriorating memory cells is greater than or equal to the reference value, the control logic 1250 may determine the shrink-life state. As another example, the control logic 1250 may determine the normal life state or the shrink-life state according to the marking (for example, a using time, access frequency) specified by a memory chip included in the memory cell array 1210. As other example, the control logic 1250 may divide the shrink-life state into multiple sub-states (for example, a first shrink-life state, a second shrink-life state, a third shrink-life state, or the like) according to a plurality of reference values. When the memory cells are determined to be in or to have the normal life state (for example, NO in the operation S120 of FIG. 5), the control logic 1250 may perform operation S130. When the memory cells are determined to be in or to have the shrink-life state (for example, YES in the operation S120 of FIG. 5), the control logic 1250 may perform operation S140.

According to an example embodiment, in operation S130, when the memory cells are not in the shrink-life state (or the memory cells are in normal life state), the memory device 1200 may monitor a result of the life test. For example, the control logic 1250 may perform the life test of the operation S110 periodically. The control logic 1250 may repeatedly or iteratively (e.g., periodically) perform the operation S120 based on the result of the life test.

According to an example embodiment, in operation S140, when the memory cells are in the shrink-life state, the memory device 1200 may decrease or drop a wordline voltage during a write operation WR or a read operation RD. For example, in FIG. 3, the memory cell MC may include the cell transistor CT and the cell capacitor CC. If the cell transistor CT deteriorates, a life expectancy of the memory cell MC may be reduced. If high voltage applied to the cell transistor CT through the wordline WL persists, the cell transistor CT may continue to deteriorate, and then the life expectancy of the memory cell MC may be reduced progressively. Accordingly, if a wordline voltage applied to the cell transistor CT is dropped, the life expectancy of the memory cell MC may be extended. As an example, the control logic 1250 may provide a second wordline voltage smaller than a first wordline voltage, which is applied in the normal life state, through the wordline WL during the write operation WR or the read operation RD responsive to determining that the memory cells are in or have the shrink-life state.

As described above, in the memory device 1200 according to example embodiments, it is determined whether the life expectancy of the memory cells included in the memory cell array 1210 is reduced by the life test. When the memory cells are determined to be in or have the shrink-life state based on a result of the life test, the memory device 1200 may drop the wordline voltage applied to the cell transistor CT during the write operation WR or the read operation RD to extend the life expectancy of the memory cells.

Figure 6:
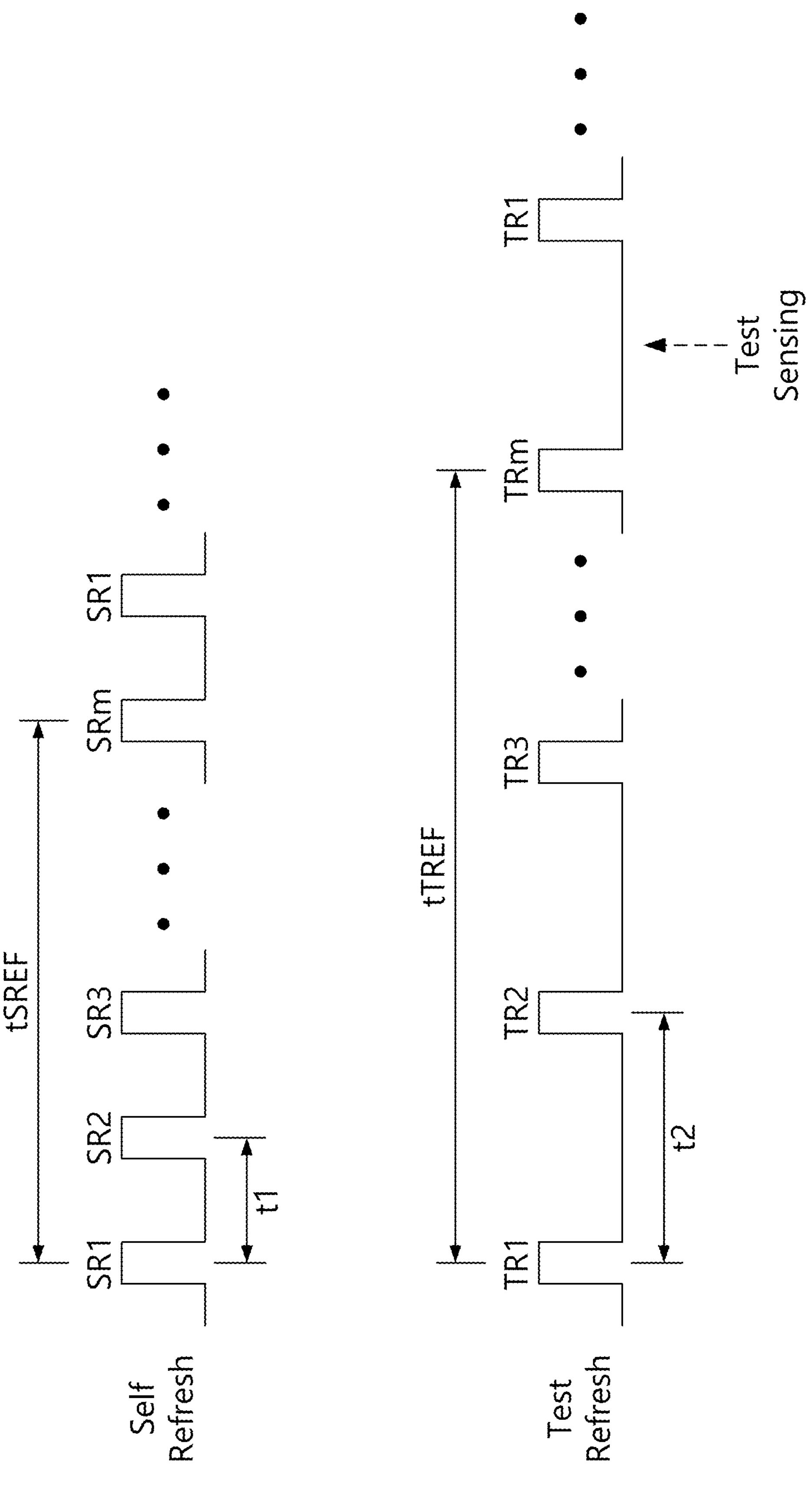
FIG. 6 is a diagram illustrating a period of test refresh operation used in a life test of FIG. 5.

FIG. 6 is a diagram illustrating a period of a test refresh operation (referred to herein as a test refresh) used in the life test of FIG. 5. Referring to FIGS. 2, 5 and 6, the memory device 1200 may perform test refresh having a period, different from a period of a self-refresh operation (which is configured to maintain data in the memory cells of the volatile memory device; also referred to herein as a self-refresh), to predict the life expectancy of a memory cell.

According to an example embodiment, the memory device 1200 may periodically perform self-refresh to maintain data stored in memory cells. For example, the memory device 1200 may perform the self-refresh by sequentially selecting wordlines connected to the memory cell array 1210. The memory device 1200 may determine a total self-refresh time tSREF during which the self-refresh is performed on all wordlines once. The total self-refresh time tSREF (for example, 64 milliseconds (ms)) may be set in consideration of retention times of memory cells. As an example, the memory device 1200 may perform first self-refresh SR1 corresponding to a first wordline. Similarly, when the number of wordlines is m, the memory device 1200 may perform self-refreshes SR1, SR2, SR3 to SRm, respectively corresponding to wordlines. A first time period t1 may be required between the respective self-refreshes (for example, between the first self-refresh SR1 and the second self-refresh SR2).

According to an example embodiment, the memory device 1200 may perform test refresh for a method of predicting the life expectancy of the memory cell. For example, the memory device 1200 may perform the test refresh, independent of the self-refresh, to predict the life expectancy of the memory cell. The test refresh may be performed at a longer cycle (i.e., a greater period) than the self-refresh. The memory device 1200 may determine a total test refresh time tTREF during which the test refresh is performed on all wordlines once. The total test refresh time tTREF may be set to be longer than the total self-refresh time tSREF. As an example, the total test refresh time tTREF (for example, 128 ms) may be set to be an integer multiple of the total self-refresh time tSREF. The memory device 1200 may perform first test refresh TR1 corresponding to the first wordline. Similarly, when the number of wordlines is m, the memory device 1200 may perform test refreshes TR1, TR2, TR3 to TRm, respectively corresponding to the wordlines. A second time period t2 may be required between the respective test refreshes (for example, between the first test refresh TR1 and the second test refresh TR2). The second time period t2 may be set to be greater than the first time period t1. Alternatively, the second time period t2 may be set to be an integer multiple of the first time period t1.

According to an example embodiment, the memory device 1200 may detect a deteriorated memory cell through the test refresh. For example, when a refresh period may be increased (e.g., from t1 to t2), a current leakage phenomenon may occur in the deteriorated memory cell. When the self-refresh is performed, the deteriorated memory cell may maintain stored data. However, when the test refresh having a period, longer than a period of the self-refresh, is performed, current may leak, and thus the deteriorated memory cell may not retain stored data. The memory device 1200 may store dummy data in memory cells and perform the test refresh, and may then perform test sensing to detect the number of memory cells which do not maintain data. The memory device 1200 may predict life expectancy of the memory device 1200 based on the number of the memory cells which do not maintain data.

Figure 7:
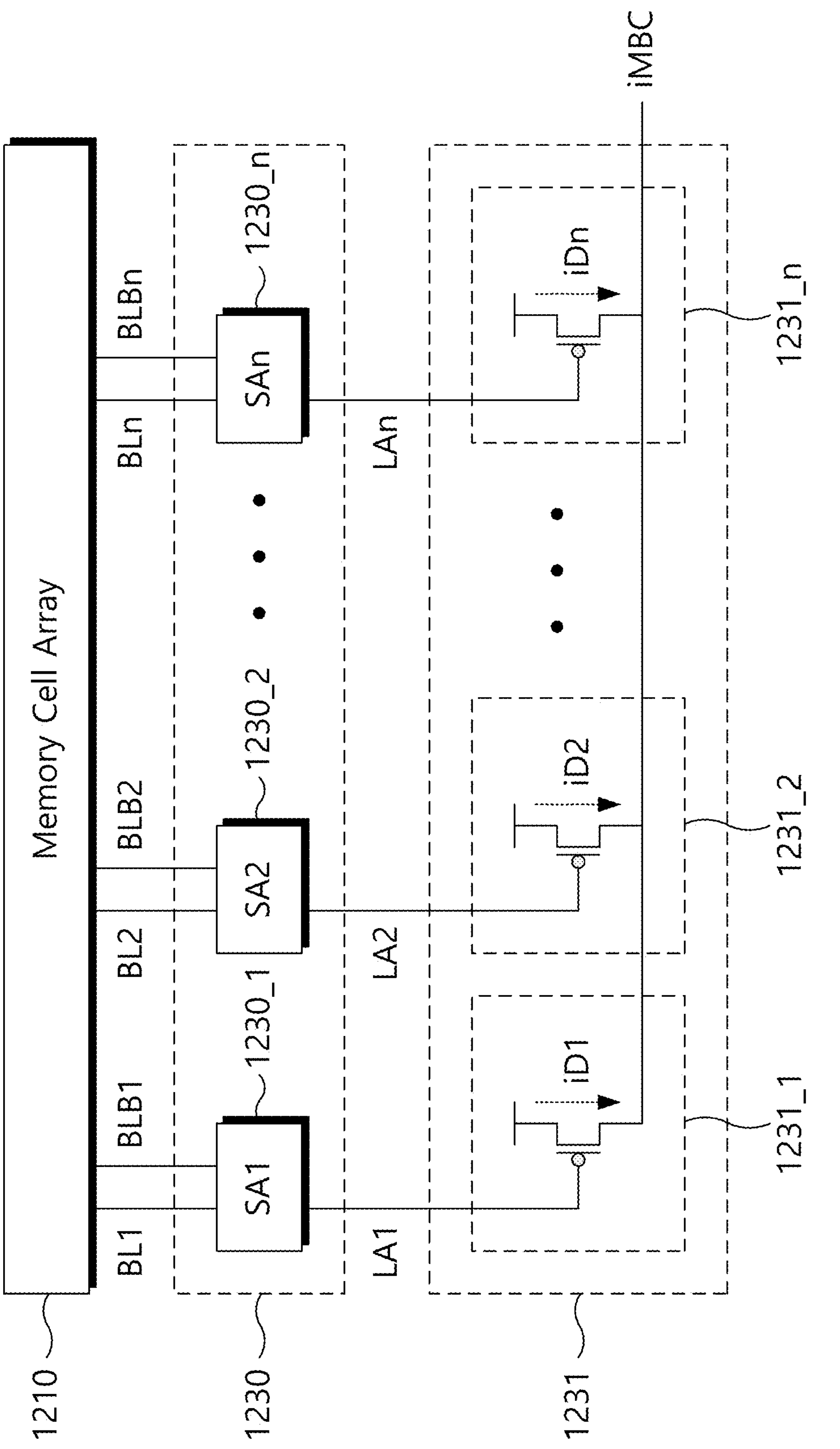
FIG. 7 is a diagram illustrating a data merge path for the life test of FIG. 5.

FIG. 7 is a diagram illustrating a data merge path for the life test of FIG. 5. Referring to FIGS. 2 to 7, after storing dummy data in memory cells connected to a selected wordline and performing test refresh, the bitline sense amplifier 1230 may perform a test sensing operation on the memory cells connected to the selected wordline. A degradation detection circuit 1231 may measure multi-bit-count current iMBC during the test sensing operation. The degradation detection circuit 1231 may be included in the bitline sense amplifier 1230 or configured to be independent of the bitline sense amplifier 1230.

According to an example embodiment, the bitline sense amplifier 1230 may include sense amplifiers, respectively connected to memory cells included in the memory cell array 1210. For example, when the number of memory cells connected to a single wordline is n (where n is a positive integer), the bitline sense amplifier 1230 may include n sense amplifiers 1230_1, 1230_2 to **1230_*n*. Each of the sense amplifiers 1230_1, 1230_2 to 1230_*n* may be configured as illustrated in FIG. 4. For example, the first sense amplifier 1230_1 may be connected to a first bitline BL1, a first complementary bitline BLB1, and a first control line LA1. The first control line LA1 may be connected to a first degradation detection path 1231_1. The first degradation detection path 1231_1 may output first degradation detection current iD1 based on a voltage level of the first control line LA1**.

According to an example embodiment, the degradation detection circuit 1231 may include degradation detection paths 1231_1, 1231_2 to **1231_*n*, respectively corresponding to the sense amplifiers 1230_1, 1230_2 to 1230_*n*. For example, control lines LA1, LA2 to LAn of the sense amplifiers 1230_1, 1230_2 to 1230_*n* may be connected to the degradation detection paths 1231_1, 1231_2 to 1231_n, respectively. The degradation detection paths 1231_1, 1231_2 to 1231_n may output or may not output degradation detection currents iD1, iD2 to iDn based on voltages of the control lines LA1, LA2 to LAn, respectively. The degradation detection circuit 1231 may merge the degradation detection currents iD1, iD2** to iDn into single current to output the multi-bit-count current iMBC.

According to an example embodiment, the memory device 1200 may store dummy data in the memory cell array 1210 and perform a test refresh, and may then confirm the multi-bit-count current iMBC for each wordline. For example, memory cells included in the memory cell array 1210 may exhibit different aspects depending on the degree of deterioration. As an example, in the case of a normal memory cell, data of the memory cell may be normally maintained even after performing the test refresh, similarly to the self-refresh. In the case of a deteriorating memory cell, data of the memory cell may be not normally maintained after performing the test refresh, different from the self-refresh, due to deterioration of a cell transistor or a cell capacitor.

According to an example embodiment, the multi-bit-count current iMBC may increase in proportion to the number of deteriorated memory cells, among memory cells connected to a selected wordline. For example, the degradation detection circuit 1231 may include the degradation detection paths 1231_1, 1231_2 to 1231_n, respectively corresponding to the sense amplifiers 1230_1, 1230_2 to 1230_n. The degradation detection paths 1231_1, 1231_2 to 1231_n may output or may not output the degradation detection currents iD1, iD2 to iDn based on voltages of control lines LA1, LA2 to LAn of the sense amplifiers 1230_1, 1230_2 to 1230_n, respectively. As an example, each of the degradation detection paths 1231_1, 1231_2 to 1231_n may include a PMOS transistor. When a voltage of each of the control lines LA1, LA2 to LAn is at a high level (or logic "1") (for example, when a corresponding memory is normal), the deterioration detection paths 1231_1, 1231_2 to 1231_n may output the deterioration detection currents iD1, iD2 to iDn, respectively. When a voltage of each of the control lines LA1, LA2 to LAn is at a low level (or logic "0") (for example, when a corresponding memory cell is deteriorated), the deterioration detection paths 1231_1, 1231_2 to 1231_n may not output the deterioration detection currents iD1, iD2 to iDn, respectively. The deterioration detection currents iD1, iD2 to iDn may be merged into single current to output the multi-bit-count current iMBC.

Figure 8:
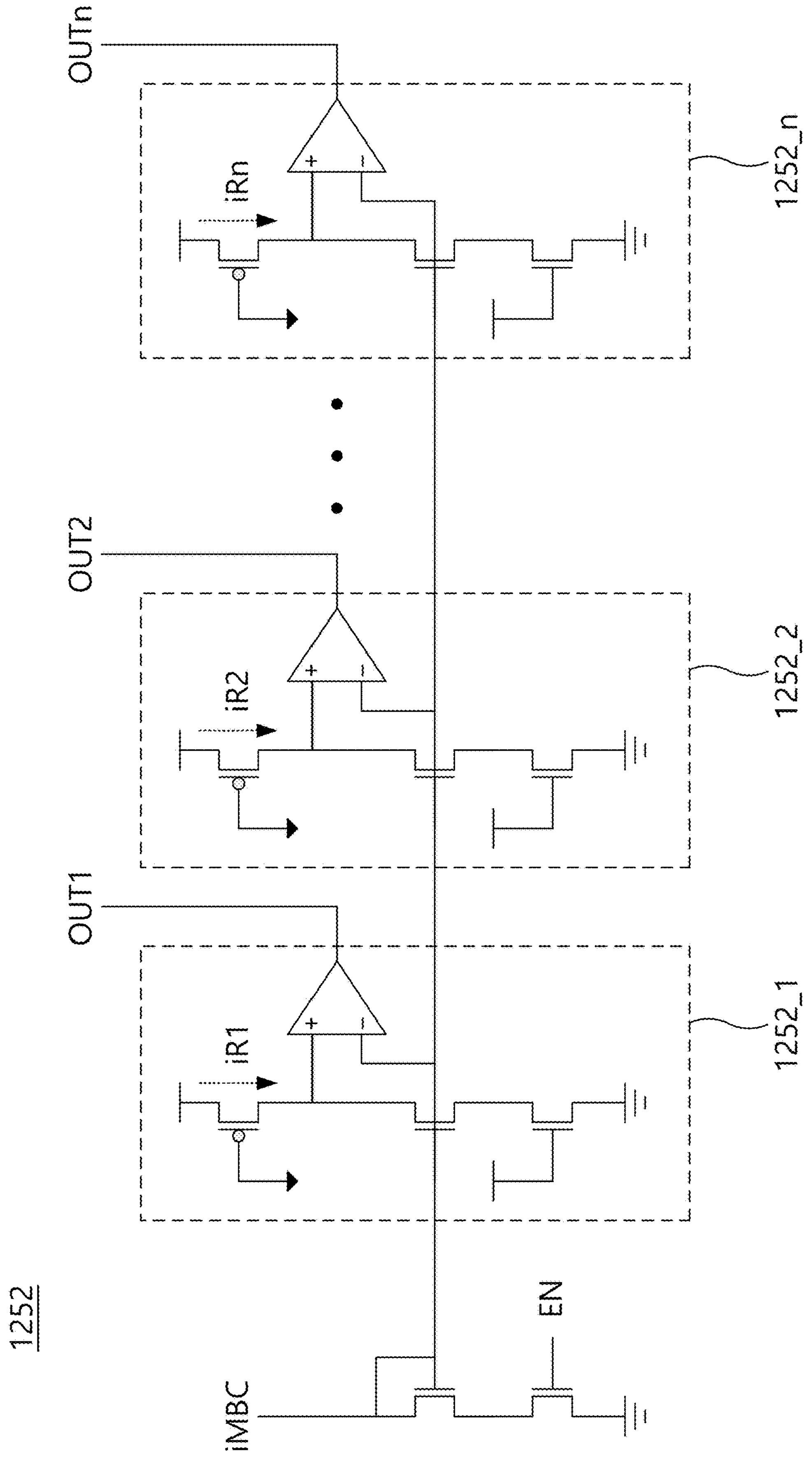
FIG. 8 is a diagram illustrating a multi-bit counter detecting the number of deteriorating memory cells based on multi-bit-count current obtained by a deterioration detection circuit of FIG. 7.

FIG. 8 is a diagram illustrating a multi-bit counter circuit detecting the number of deteriorating memory cells based on multi-bit-count current iMBC obtained by a deterioration detection circuit of FIG. 7. FIG. 9 is a table for predicting life expectancy of the memory device of FIG. 2 based on a result of the multi-bit counter of FIG. 8. Referring to FIGS. 8 and 9, the memory device 1200 may count the number of deteriorating memory cells included in the memory cell array 1210 based on the multi-bit-count current iMBC. The memory device 1200 may include a circuit that functions as a multi-bit counter 1252. The multi-bit counter 1252 may be included in the control logic 1250, or may be implemented to independent of the control logic 1250. The life test of FIG. 5 may be performed by the degradation detection circuit 1231 of FIG. 7 and the multi-bit counter 1252 of FIG. 8.

According to an example embodiment, the multi-bit counter 1252 may include a plurality of bit counters 1252_1, 1252_2 to 1252_n. For example, the multi-bit-count current iMBC may be transmitted to the bit counters 1252_1, 1252_2 to 1252_n based on an enable signal EN. A single bit counter (for example, a first bit counter 1252_1) may compare reference current (for example, first reference current iR1) with the multi-bit-count current iMBC to obtain a result value (for example, a first result value OUT1). As an example, reference currents iR1, iR2 to iRn of the bit counters 1252_1, 1252_2 to 1252_n may be gradually increased. A current increment between the gradually increased reference currents iR1, iR2 to iRn may be the same as a magnitude of each of the deterioration detection currents iD1, iD2 to iDn of FIG. 6. The number of bit counters 1252_1, 1252_2 to 1252_n may be the same as the number of memory cells connected to a single wordline. Each of the bit counters 1252_1, 1252_2 to 1252_n may include a comparator comparing the multi-bit-count current iMBC with each of the reference currents iR1, iR2 to iRn. Capacity of the comparators, included in the bit counters 1252_1, 1252_2 to and 1252_n, may be gradually increased to correspond to the magnitudes of the reference currents iR1, iR2 to and iRn. The comparator, included in the first bit counter 1252_1, may have lowest capacity. The comparator, included in the n-th bit counter 1252_n, may have highest capacity. However, this is merely exemplary, and the number and configuration of the bit counters 1252_1, 1252_2 to 1252_n are not limited thereto.

According to an example embodiment, the memory device 1200 may measure the number of failed or failing memory cells (also referred to herein as fail memory cells), connected to a selected wordline, based on result values of the multi-bit counter 1252. For example, in FIG. 9, when the multi-bit-count current iMBC is lower than the first reference current iR1, the bit counters 1252_1, 1252_2 to 1252_n may all output result values OUT1, OUT2 to OUTn at a low level (or logic "0"). In this case, the control logic 1250 may determine that there is no fail memory cell connected to the selected wordline. When the multi-bit-count current iMBC is higher than or equal to the first reference current iR1 and lower than the second reference current iR2, the first bit counter 1252_1 may output a result value OUT1 at a high level (or logic "1"), and the other bit counters 1252_2 to 1252_n may output result values OUT2 to OUTn at a low level (or logic "0"). In this case, a single first bit counter 1252_1 has the result value OUT1 at a high level (or logic "1"), so that the control logic 1250 may determine that the number of the fail memory cells connected to the selected wordline is one. Similarly, the number of the result values OUT1, OUT2 to OUTn, changed to be at a high level as the multi-bit-count current iMBC is increased, may be increased. In this case, the control logic 1250 may determine the number of bit counters have a result value at a high level (or logic "1") as the number of the fail memory cells connected to the selected wordline. When the multi-bit-count current iMBC is higher than or equal to the n-th reference current iRn, the bit counters 1252_1, 1252_2 to 1252_n may all output result values OUT1, OUT2 to OUTn at a high level (or logic "1"). In this case, the control logic 1250 may determine that all of the memory cells connected to the selected wordline are fail memory cells.

Figure 11:
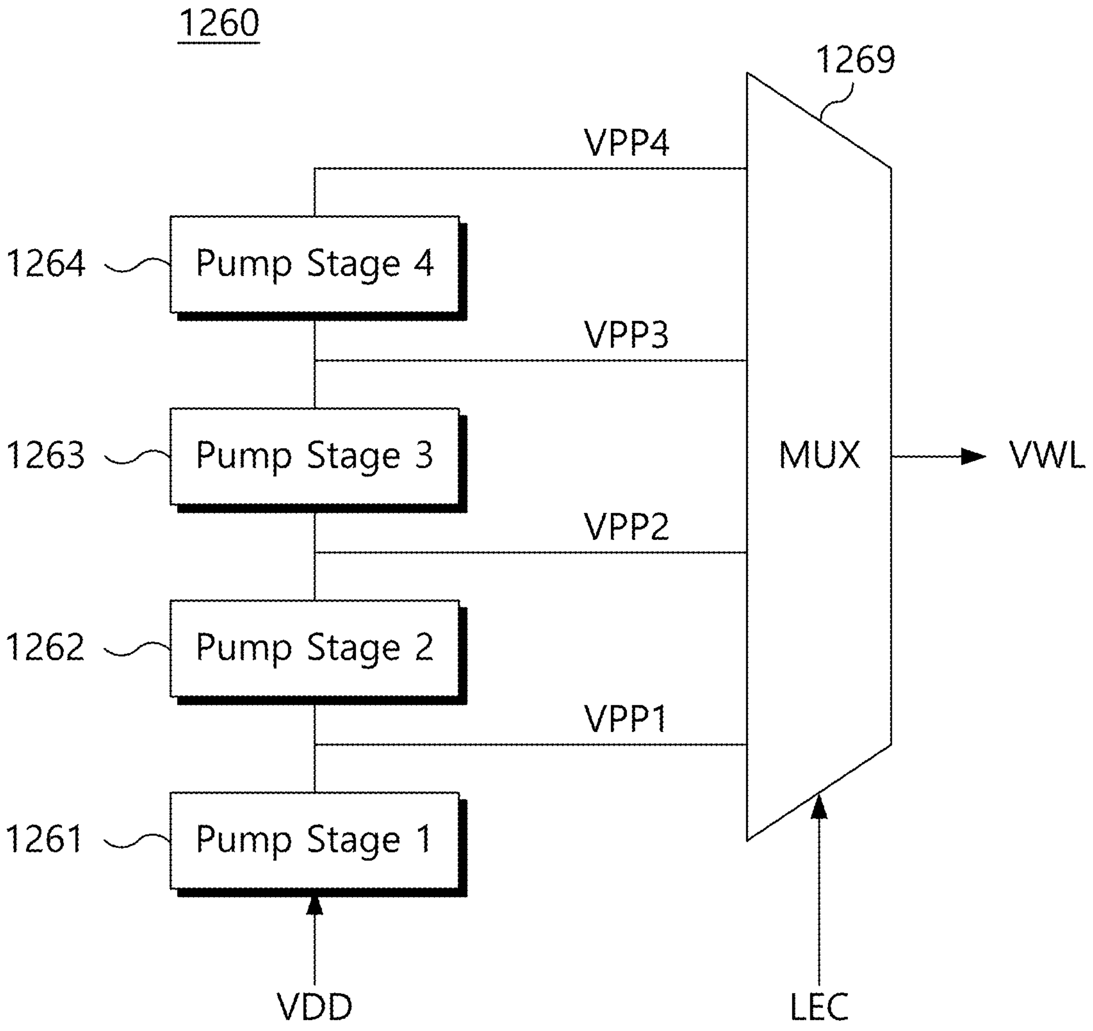
FIG. 11 is a diagram illustrating a voltage generator of FIG. 2 providing a wordline voltage based on the result of the life test of FIG. 5.

FIG. 10 is a life-evaluation-table for determining whether the life expectancy of the memory device of FIG. 2 is reduced based on a result of the life test of FIG. 5. FIG. 11 is a diagram illustrating a voltage generator of FIG. 2 providing a wordline voltage based on the result of the life test of FIG. 5. Referring to FIGS. 2, 5, 10 and 11, the memory device 1200 may control a wordline voltage based on a result of the life test of FIG. 5.

According to an example embodiment, the control logic 1250 may determine whether memory cells of the memory cell array 1210 are in the shrink-life state based on the result of the life test of FIG. 5. For example, the control logic 1250 may determine whether the memory cells of the memory cell array 1210 are in the shrink-life state according to the number of fail memory cells. The control logic 1250 may count the number of the fail memory cells. As an example, the control logic 1250 may count the number of fail memory cells by memory banks. As another example, the control logic 1250 may count the number of fail memory cells by memory chips. As other example, the control logic 1250 may count the number of fail memory cells by memory modules. In FIG. 10, N may be the number of total memory cells included in one wordline, one memory bank, one memory chip or one memory module. FB may be the number of fail memory cells included in one wordline, one memory bank, one memory chip or one memory module.

According to an example embodiment, in a first life case, when the number of the fail memory cells FB is smaller than a quarter of the number of the total memory cells N, the control logic 1250 may determine a normal life state. In the first life case, when the number of the fail memory cells FB is greater than or equal to a quarter of the number of the total memory cells N, the control logic 1250 may determine a shrink-life state. In a second life case, when the number of the fail memory cells FB is smaller than a half of the number of the total memory cells N, the control logic 1250 may determine the normal life state. In the second life case, when the number of the fail memory cells FB is greater than or equal to a half of the number of the total memory cells N, the control logic 1250 may determine the shrink-life state. In a third life case, when the number of the fail memory cells FB is smaller than three quarters of the number of the total memory cells N, the control logic 1250 may determine the normal life state. In the third life case, when the number of the fail memory cells FB is greater than or equal to three quarters of the number of the total memory cells N, the control logic 1250 may determine the shrink-life state. However, this is merely exemplary and the control logic 1250 may determine the normal life state or the shrink-life state based on a specified threshold or reference value. Furthermore, the control logic 1250 may change the reference value according to a refresh period of the test refresh while changing the refresh period of the test refresh. As an example, if the refresh period of the test refresh is increased, the control logic 1250 may increase the reference value.

According to an example embodiment, the control logic 1250 may set a plurality of shrink-life states based on fail memory cells FB. For example, in a fourth life case, when the number of the fail memory cells FB is smaller than a quarter of the number of the total memory cells N, the control logic 1250 may determine a normal life state. When the number of the fail memory cells FB is greater than or equal to a quarter of the number of the total memory cells N and smaller than a half of the number of the total memory cells N, the control logic 1250 may determine a first shrink-life state. When the number of the fail memory cells FB is greater than or equal to a half of the number of the total memory cells N and smaller than three quarters of the number of the total memory cells N, the control logic 1250 may determine a second shrink-life state. When the number of the fail memory cells FB is greater than or equal to three quarters of the number of the total memory cells N, the control logic 1250 may determine a third shrink-life state.

According to an example embodiment, a voltage generator 1260 may output various wordline voltages VWL based on whether memory cells of the memory cell array 1210 are in the shrink-life state. For example, the voltage generator 1260 may include a plurality of pump stages (for example, a first pump stage 1261, a second pump stage 1262, a third pump stage 1263, and a fourth pump stage 1264). The first pump stage 1261 may amplify a supply voltage VDD to generate a first internal voltage VPP1. The second pump stage 1262 may amplify the first internal voltage VPP1 to generate a second internal voltage VPP2. The third pump stage 1263 may amplify the second internal voltage VPP2 to generate a third internal voltage VPP3. The fourth pump stage 1264 may amplify the third internal voltage VPP3 to generate a fourth internal voltage VPP4. The voltage generator 1260 may include a multiplexer 1269. The multiplexer 1269 may output one of the first to fourth internal voltages VPP1, VPP2, VPP3 and VPP4 as the wordline voltage VWL based on a life-extend-control signal LEC. The control logic 1250 may generate the life-extend-control signal LEC according to whether the memory cells of the memory cell array 1210 are in the shrink-life state.

According to an example embodiment, the voltage generator 1260 may output one of the first to fourth internal voltages VPP1, VPP2, VPP3 and VPP4 based on the life-extend-control signal LEC. For example, in the normal life state, the control logic 1250 may transmit a first life-extend-control signal LEC1 to the multiplexer 1269. When receiving the first life-extend-control signal LEC1, the multiplexer 1269 may output the fourth internal voltage VPP4, which is the greatest among the internal voltages, as the wordline voltage VWL. In the shrink-life state, the control logic 1250 may transmit a second life-extend-control signal LEC2 to the multiplexer 1269. When receiving the second life-extend-control signal LEC2, the multiplexer 1269 may output one of the first to third internal voltages VPP1, VPP2 and VPP3, which are smaller than the fourth internal voltage VPP4, as the wordline voltage VWL.

As other example, in the fourth life case, the control logic 1250 may generate a third life-extend-control signal LEC21 in the first shrink-life state. The control logic 1250 may generate a fourth life-extend-control signal LEC22 in the second shrink-life state. The control logic 1250 may generate a fifth life-extend-control signal LEC23 in the third shrink-life state. The multiplexer 1269 may output the third internal voltage VPP3 when receiving the third life-extend-control signal LEC21. The multiplexer 1269 may output the second internal voltage VPP2 when receiving the fourth life-extend-control signal LEC22. The multiplexer 1269 may output the first internal voltage VPP1 when receiving the fifth life-extend-control signal LEC23.

Figure 12:
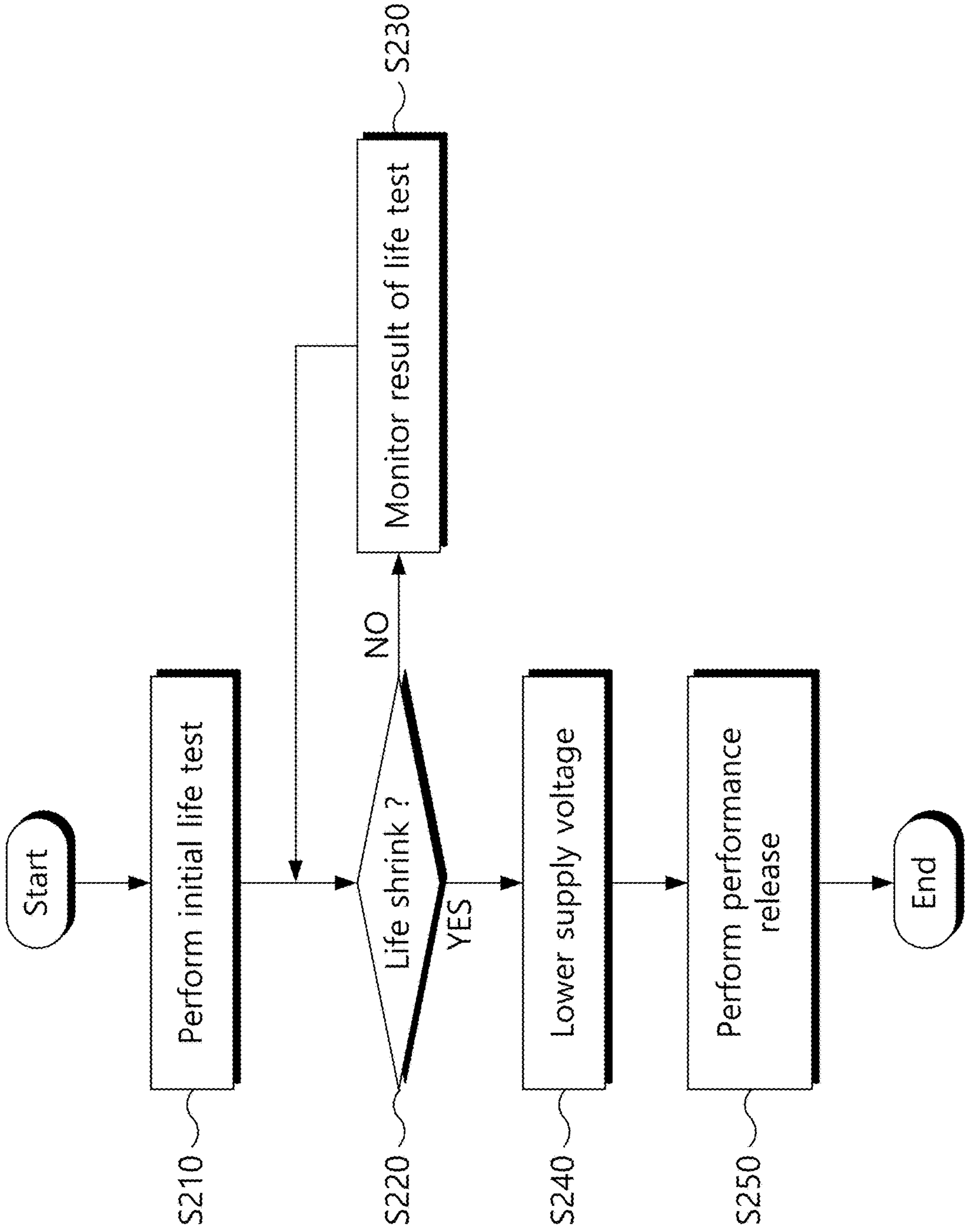
FIG. 12 is a flowchart illustrating another example embodiment of the method for extending the life expectancy of a memory device of FIG. 2.

FIG. 12 is a flowchart illustrating another example embodiment of the method for extending the life expectancy of a memory device of FIG. 2. Referring to FIGS. 1, 2 and 12, the memory device 1200 may receive a low supply voltage VDD from the memory controller 1100 to extend the life expectancy of memory cells included in the memory cell array 1210 when the memory cells included in the memory cell array 1210 is reduced.

According to an example embodiment, in operation S210, the memory device 1200 may perform an initial life test. For example, the control logic 1250 may perform the initial life test for detecting a deterioration state of memory cells included in the memory cell array 1210. As an example, the control logic 1250 may perform a read operation after increasing a refresh period to determine a retention character of the memory cells, and then the control logic 1250 may count the number of memory cells representing read-failure. As another example, the control logic 1250 may detect life expectancy of memory cells based on a marking (for example, a using time, access frequency) specified by a memory chip included in the memory cell array 1210. However, this is merely exemplary and the control logic 1250 may detect the deterioration state of memory cells included in the memory cell array 1210 in various ways.

According to an example embodiment, in operation S220, the memory device 1200 may determine whether the memory cells included in the memory cell array 1210 are in a shrink-life state. For example, the control logic 1250 may designate a life state of the memory cells based on the number of deteriorating memory cells confirmed by the life test. As an example, the control logic 1250 may distinguish the normal life state and the shrink-life state according to the number of the deteriorating memory cells. When the number of the deteriorating memory cells is smaller than a reference value, the control logic 1250 may determine the normal life state. When the number of the deteriorating memory cells is greater than or equal to the reference value, the control logic 1250 may determine the shrink-life state. As another example, the control logic 1250 may determine the normal life state or the shrink-life state according to the marking (for example, a using time, access frequency) specified by a memory chip included in the memory cell array 1210. As other example, the control logic 1250 may divide the shrink-life state into multiple sub-states (for example, a first shrink-life state, a second shrink-life state, a third shrink-life state, or the like) according to a plurality of reference values. When the memory cells are determined in the normal life state (for example, NO in the operation S220 of FIG. 12), the control logic 1250 may perform operation S230. When the memory cells are determined in the shrink-life state (for example, YES in the operation S220 of FIG. 12), the control logic 1250 may perform operation S240.

According to an example embodiment, in operation S230, when the memory cells are not in the shrink-life state (or the memory cells are in normal life state), the memory device 1200 may monitor a result of the life test. For example, the control logic 1250 may perform the life test of the operation S210 periodically. The control logic 1250 may repeatedly perform the operation S220 based on the result of the periodical life test.

According to an example embodiment, in operation S240, when the memory cells are in the shrink-life state, the memory device 1200 may lower (i.e., reduce or decrease) a supply voltage VDD. For example, the control logic 1250 may generate the life-extend-control signal LEC of FIGS. 10 and 11. The memory device 1200 may transmit the life-extend-control signal LEC to the memory controller 1100. The memory controller 1100 may transmit a supply voltage VDD smaller than a voltage supplied in the normal life state to the memory device 1200 based on the life-extend-control signal LEC. As an example, the memory controller 1100 may transmit a supply voltage VDD that is reduced or lowered in steps. As other example, the memory controller 1100 may transmit a supply voltage VDD of which slope is lower than one of a voltage in the normal life state. In other words, the memory controller 1100 may be configured to provide the supply voltage at a voltage level that is reduced in a graded or stepwise manner. If a supply voltage VDD is lowered, a stress given in the memory cells is lowered, and then the life expectancy of the memory device 1200 may be extended.

According to an example embodiment, in operation S250, the memory device 1200 may perform a performance release operation. For example, if a supply voltage VDD is lowered, the life expectancy of the memory cells may be extended. However, a performance of the memory device 1200 may decrease. Accordingly, the performance release operation may be performed to compensate for a decreased performance of the memory device 1200. As an example, the memory device 1200 may extend the operation time that may be required by an internal unit operation (for example, an active operation, a precharge operation, a read operation or a write operation) based on the lowered supply voltage VDD. As other example, the memory device 1200 may extend a clock time of an internal clock used in the internal unit operation based on the lowered supply voltage VDD. The memory device 1200 may compensate for the decreased performance by using the lowered supply voltage VDD according to the performance release operation.

As described above, in the memory device 1200 according to example embodiments, it is determined whether the life expectancy of the memory cells included in the memory cell array 1210 is reduced by the life test. When the memory cells in the shrink-life state based on a result of the life test, the memory device 1200 may lower the supply voltage VDD to extend the life expectancy of the memory cells. Furthermore, to compensate for the decreased performance by using the lowered supply voltage VDD, the memory device 1200 may perform the performance release operation, and then a decline in performance of the memory device 1200 may be reduced or minimized.

Figure 13:
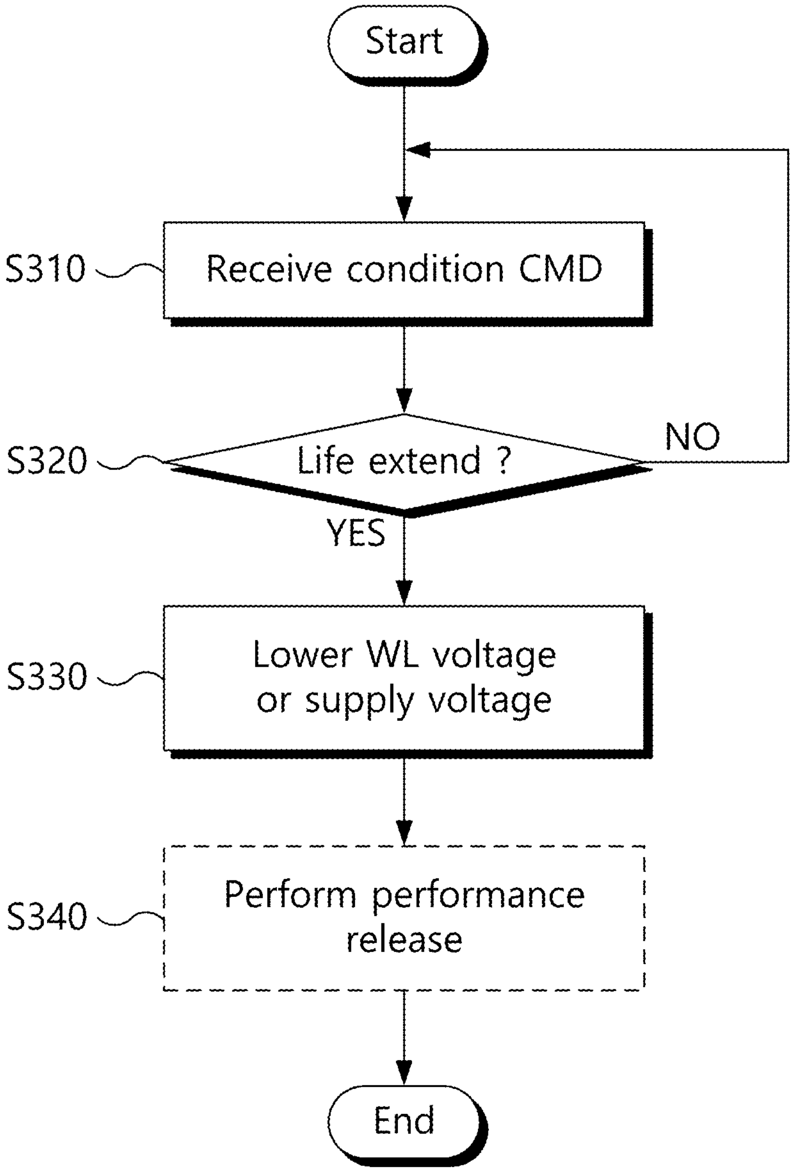
FIG. 13 is a flowchart illustrating other example embodiment of the method for extending the life expectancy of a memory device of FIG. 2.

FIG. 13 is a flowchart illustrating other example embodiment of the method for extending the life expectancy of a memory device of FIG. 2. Referring to FIGS. 1, 2 and 13, the memory device 1200 may extend the life expectancy of memory cells based on a condition command received from the memory controller 1100.

According to an example embodiment, in operation S310, the memory device 1200 may receive a condition command from the memory controller 1100. For example, the condition command may include information indicating whether the life expectancy of the memory device 1200 is to be extended.

According to an example embodiment, in operation S320, the memory device 1200 may determine whether the life expectancy of the memory device 1200 is to be extended based on the condition command. For example, when the condition command represents the normal life state, the control logic 1250 may wait for receiving a next condition command back to the operation S310. When the condition command represents the shrink-life state, the control logic 1250 may perform operation S330.

According to an example embodiment, in operation S330, the memory device 1200 may perform an operation for extending the life expectancy of the memory device 1200. For example, the memory device 1200 may drop a wordline voltage VWL as described in FIG. 5. Alternatively, the memory device 1200 may lower a supply voltage VDD as described in FIG. 12.

According to an example embodiment, in operation S340, selectively, the memory device 1200 may perform a performance release operation when lowering the supply voltage VDD. For example, if the supply voltage VDD is lowered, the life expectancy of the memory cells may be extended. However, a performance of the memory device 1200 may decrease. Accordingly, the performance release operation may be performed to compensate for a decreased performance of the memory device 1200. As an example, the memory device 1200 may extend an operation time required by a read operation or a write operation based on the lowered supply voltage VDD.

Figure 14:
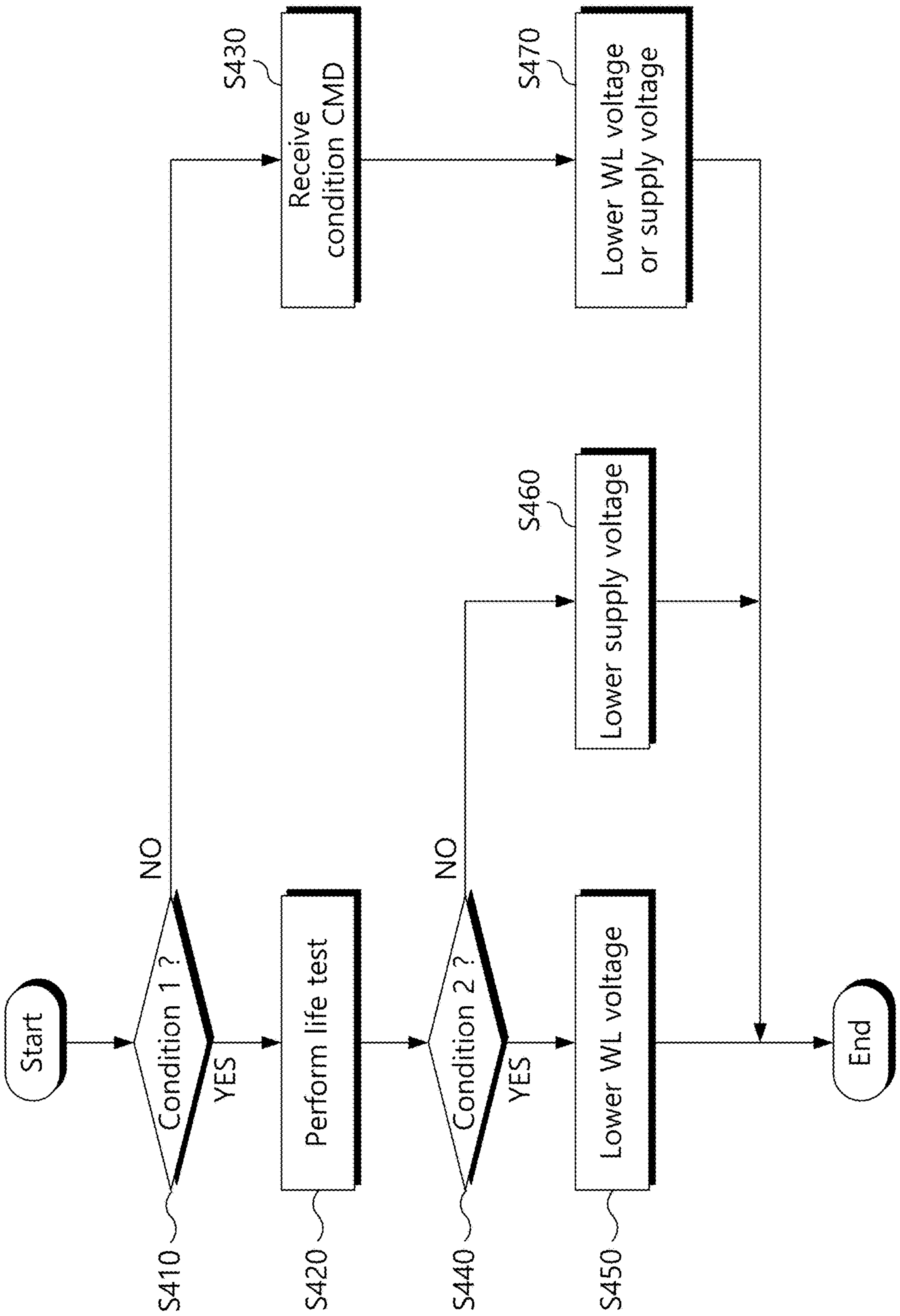
FIG. 14 is a flowchart illustrating a further example embodiment of the method for extending the life expectancy of a memory device of FIG. 2.

FIG. 14 is a flowchart illustrating a further example embodiment of the method for extending the life expectancy of a memory device of FIG. 2. Referring to FIGS. 1, 2 and 14, the memory device 1200 may perform different methods for extending the life expectancy according to conditions or circumstances.

According to an example embodiment, in operation S410, the memory device 1200 may verify a first condition. When the first condition is satisfied, the memory device 1200 may perform operation S420. When the first condition is not satisfied, the memory device 1200 may perform operation S430. For example, the first condition may be set based on an implementation feature or an implementation environment. As an example, the first condition may be verified based on whether the memory device 1200 includes a function performing the life test. When the memory device 1200 includes the function performing the life test, the memory device 1200 may perform the operation S420. When the memory device 1200 does not include the function performing the life test, the memory device 1200 may perform the operation S430. As other example, the first condition may be verified based on a place or application in which the memory device 1200 is implemented. When the memory device 1200 is implemented in a first implementation place or application (for example, a PC, a server, or a compute express link (CXL) memory), the memory device 1200 may perform the operation S420. When the memory device 1200 is implemented in a second implementation place or application (for example, a smartphone, an automobile, or home appliances), the memory device 1200 may perform the operation S430.

According to an example embodiment, in the operation S420, the memory device 1200 may perform the life test. For example, the memory device 1200 may determine whether the life expectancy of the memory device 1200 is reduced by the life test. Furthermore, the memory device 1200 may determine a cause of shrinking the life expectancy (for example, a memory cell, a peripheral circuit, or a power domain area) by the life test. As an example, the memory device 1200 may perform the life test illustrated in FIGS. 6 to 10. As other example, the memory device 1200 may measure the life expectancy of the memory device 1200 based on a marking (for example, a using time, access frequency) specified by a memory chip included in the memory cell array 1210.

According to an example embodiment, in the operation S430, the memory device 1200 may receive a condition command from the memory controller 1100. For example, the condition command may include information indicating whether the life expectancy of the memory device 1200 should be extended (for example, a direction or instruction to extend the life expectancy).

According to an example embodiment, in the operation S440, the memory device 1200 may verify a second condition. When the second condition is satisfied, the memory device 1200 may perform operation S450. When the second condition is not satisfied, the memory device 1200 may perform operation S460. For example, the second condition may be verified based on a cause of shrinking the life expectancy, verified by the life test. As an example, when the shrinking the life expectancy occurs by a deterioration of memory cells, the memory device 1200 may perform the operation S450. When the shrinking the life expectancy occurs by a cause different from the deterioration of memory cells, the memory device 1200 may perform the operation S460.

According to an example embodiment, in the operation S450, the memory device 1200 may drop a wordline voltage VWL to extend the life expectancy of the memory cells. For example, when the shrinking the life expectancy occurs by the deterioration of memory cells, the memory device 1200 may drop the wordline voltage VWL during a read operation or a write operation to extend the life expectancy of the memory cells.

According to an example embodiment, in the operation S460, the memory device 1200 may lower a supply voltage VDD to extend the life expectancy of the memory cells. For example, when the shrinking the life expectancy occurs by the cause different from the deterioration of memory cells, the memory device 1200 may operate in a supply voltage VDD smaller than a voltage supplied in the normal life state. In this case, the memory device 1200 may perform a performance release operation of FIG. 12. As an example, when there is a cause of shrinking the life expectancy in the peripheral circuit, the memory device 1200 may operate in the supply voltage VDD smaller than the voltage supplied in the normal life state. As other example, when there is a cause of shrinking the life expectancy in the power domain area, the memory device 1200 may operate in the supply voltage VDD smaller than the voltage supplied in the normal life state.

According to an example embodiment, in operation S470, the memory device 1200 may drop the wordline voltage VWL or the supply voltage VDD based on the condition command to extend the life expectancy of the memory cells. For example, the memory device 1200 may drop the wordline voltage VWL as described in FIG. 5. Alternatively, the memory device 1200 may lower the supply voltage VDD as described in FIG. 12. When lowering the supply voltage VDD, the memory device 1200 may also perform the performance release operation.

According to the present disclosure, refurbished memory devices may collect to reuse in a mass memory device (for example, CXL) for cost reduction. For example, the mass memory device may include a plurality of memory modules connected with one controller. In this case, a life expectancy of the refurbished memory devices may be extended by the method for extending the life expectancy according to the present disclosure, and then reliability of the refurbished memory devices may be increased.

According to the present disclosure, a stress given in the memory cell of the volatile memory device is reduced, and then the life expectancy of the volatile memory device is extended.

While the present disclosure has been described with reference to embodiments thereof, it will be apparent to those of ordinary skill in the art that various changes and modifications may be made thereto without departing from the scope of the present disclosure as set forth in the following claims.

What is claimed is:

1. A method for extending life expectancy of a volatile memory device, the method comprising:

executing, by control logic that is coupled to memory cells included in the volatile memory device, operations comprising:

for a first read or write operation, using a second voltage associated with a normal life state as a wordline voltage applied to a wordline connected to the memory cells;

performing a life test for the memory cells included in the volatile memory device;

determining whether the memory cells have the normal life state or a shrink-life state indicating a life expectancy is predicted to be reduced relative to the normal life state based on a result of the life test; and responsive to determining that the memory cells have the shrink-life state, for a second read or write operation, decreasing the wordline voltage applied to the wordline connected to the memory cells to a first voltage associated with the shrink-life state, the first voltage being less than the second voltage associated with the normal life state used for the first read or write operation.

2. The method of claim 1, wherein the operations further comprise:

iteratively performing the life test to monitor the result of the life test responsive to determining that the memory cells have the normal life state.

3. The method of claim 1, wherein performing the life test comprises:

measuring a number of deteriorated memory cells among the memory cells responsive to a test refresh operation having a period that is greater than a period of a self-refresh operation that is configured to maintain data in the memory cells.

4. The method of claim 3, wherein determining whether the memory cells have the normal life state or the shrink-life state comprises:

determining that the memory cells have the normal life state when the number of the deteriorated memory cells is smaller than a reference value; and determining that the memory cells have the shrink-life state when the number of the deteriorated memory cells is greater than or equal to the reference value.

5. The method of claim 4, wherein the reference value is increased when a refresh period of the test refresh operation is increased.

6. The method of claim 3, wherein the volatile memory device comprises a voltage generator, and the method further comprises:

amplifying, by the voltage generator, a supply voltage to generate the second voltage and the first voltage that is less than the second voltage; and providing, by the voltage generator, the second voltage as the wordline voltage in the normal life state and the first voltage as the wordline voltage in the shrink-life state.

7. The method of claim 3, wherein the volatile memory device comprises a voltage generator that is configured to amplify a supply voltage to output the wordline voltage, and the method further comprises:

amplifying, by a first pump stage, the supply voltage to generate a first internal voltage;

amplifying, by a second pump stage, the first internal voltage to generate a second internal voltage;

amplifying, by a third pump stage, the second internal voltage to generate a third internal voltage; and outputting, by a multiplexer, one of the first internal voltage, the second internal voltage or the third internal voltage.

8. The method of claim 7, further comprising:

outputting the third internal voltage from the multiplexer when the number of the deteriorated memory cells is smaller than a first reference value;

outputting the second internal voltage from the multiplexer when the number of the deteriorated memory cells is greater than or equal to the first reference value and smaller than a second reference value; and outputting the first internal voltage from the multiplexer when the number of the deteriorated memory cells is greater than the second reference value.

9. The method of claim 8, wherein the operations further comprise:

transmitting a first life-extend-control signal to the multiplexer when the number of the deteriorated memory cells is smaller than the first reference value, transmitting a second life-extend-control signal to the multiplexer when the number of the deteriorated memory cells is greater than or equal to the first reference value and smaller than the second reference value, and transmitting a third life-extend-control signal to the multiplexer when the number of the deteriorated memory cells is greater than the second reference value.

10. A method for extending life expectancy of a volatile memory device, the method comprising:

executing, by control logic that is coupled to memory cells included in the volatile memory device, operations comprising:

for a first read or write operation, receiving, from a memory controller, a first supply voltage associated with a normal life state;

performing a life test for the memory cells included in the volatile memory device;

determining whether the memory cells have the normal life state or a shrink-life state indicating a life expectancy is predicted to be reduced relative to the normal life state based on a result of the life test; and responsive to determining that the memory cells have the shrink-life state, for a second read or write operation, receiving, from the memory controller, a second supply voltage associated with the shrink-life state, the second supply voltage being less than the first supply voltage associated with the normal life state.

11. The method of claim 10, wherein the operations further comprise:

transmitting a life-extend-control signal to the memory controller responsive to determining that the memory cells are in the shrink-life state; and responsive to transmitting the life-extend-control signal, receiving, from the memory controller, the second supply voltage that is less than the first supply voltage associated with the normal life state.

12. The method of claim 11, wherein the second supply voltage decreases in a stepwise fashion compared with the first supply voltage.

13. The method of claim 11, wherein the second supply voltage decreases in a graded fashion compared with the first supply voltage.

14. The method of claim 10, wherein the operations further comprise:

performing a performance release operation during the second read or write operation of the memory cells responsive to determining that the memory cells have the shrink-life state.

15. The method of claim 14, wherein performing the performance release operation increases an operation time to perform the second read or write operation.

16. The method of claim 10, wherein the operations further comprise:

iteratively performing the life test to monitor the result of the life test responsive to determining that the memory cells have the normal life state.

17. A method for extending life expectancy of a volatile memory device, the method comprising:

executing, by control logic that is coupled to memory cells included in the volatile memory device, operations comprising:

for a first read or write operation, using a second voltage associated with a normal life state as a wordline voltage applied to a wordline connected to the memory cells;

verifying whether a state of the volatile memory device satisfies a first condition;

performing a predicted life test for the memory cells included in the volatile memory device when the state of the volatile memory device satisfies the first condition;

verifying whether the state of the volatile memory device satisfies in a second condition;

when the state of the volatile memory device satisfies the second condition, for a second read or write operation, decreasing the wordline voltage applied to the wordline connected to the memory cells to a first voltage associated with the second condition, the first voltage being less than the second voltage associated with the normal life state used for the first read or write operation.

18. The method of claim 17, wherein the operations further comprise:

receiving a condition command from a memory controller when the state of the volatile memory device does not satisfy the first condition.

19. The method of claim 18, wherein, when the condition command includes a life-extend-control signal:

the wordline voltage is less than the second voltage associated with the normal life state, or a supply voltage received from the memory controller is lower than the second voltage associated with the normal life state used for the first read or write operation.

20. The method of claim 17, wherein the operations further comprise:

when the state of the volatile memory device does not satisfy the second condition, receiving, from a memory controller, a supply voltage that is less than the second voltage associated with the normal life state.

* * * * *